(12) United States Patent
Ling et al.

(10) Patent No.: US 9,480,125 B2
(45) Date of Patent: Oct. 25, 2016

(54) LIGHT-EMITTING STRUCTURE AND A METHOD FOR FABRICATING THE SAME

(75) Inventors: Peiching Ling, San Jose, CA (US); Dezhong Liu, San Jose, CA (US)

(73) Assignee: ACHROLUX INC, San Jose, CA (US)

( * ) Notice: Subject to any disclaimer, the term of this patent is extended or adjusted under 35 U.S.C. 154(b) by 544 days.

(21) Appl. No.: 13/704,788

(22) PCT Filed: Jun. 17, 2011

(86) PCT No.: PCT/US2011/040834
§ 371 (c)(1),
(2), (4) Date: Feb. 22, 2013

(87) PCT Pub. No.: WO2011/159987
PCT Pub. Date: Dec. 22, 2011

(65) Prior Publication Data
US 2013/0140983 A1    Jun. 6, 2013

Related U.S. Application Data

(60) Provisional application No. 61/355,557, filed on Jun. 17, 2010.

(51) Int. Cl.
 H05B 33/10   (2006.01)
 H05B 33/12   (2006.01)
 H01L 33/50   (2010.01)
(52) U.S. Cl.
 CPC ............. H05B 33/10 (2013.01); H01L 33/508 (2013.01); H05B 33/12 (2013.01); H01L 33/501 (2013.01); H01L 2933/0041 (2013.01)

(58) Field of Classification Search
 CPC ..... H05B 33/10; H05B 33/12; H01L 33/501; H01L 33/508
 See application file for complete search history.

(56) References Cited

U.S. PATENT DOCUMENTS

| | | |
|---|---|---|
| 2005/0239227 A1 | 10/2005 | Aanegola et al. |
| 2006/0202105 A1 | 9/2006 | Krames et al. |
| 2008/0048200 A1 | 2/2008 | Mueller et al. |
| 2010/0006875 A1 | 1/2010 | Naum |
| 2010/0012657 A1 | 1/2010 | Levey |
| 2010/0012957 A1 * | 1/2010 | Lin et al. ................ 257/98 |

OTHER PUBLICATIONS

International Search Report for PCT/US2011/40834 mailed on Oct. 21, 2011.
Written Opinion for PCT/US2011/40834 mailed on Oct. 21, 2011.

* cited by examiner

*Primary Examiner* — Andrew Coughlin
(74) *Attorney, Agent, or Firm* — Amin, Turocy & Watson LLP

(57) ABSTRACT

A light-emitting structure and a method of fabricating the light-emitting structure. The method includes covering an LED die provided on a carrier with a uniform phosphor layer, with an accommodation space constituted by the carrier and the uniform phosphor layer; and forming in the accommodation space a first light-pervious body such that the uniform phosphor layer in various shapes is formed on the LED die. The light-emitting structure thus fabricated has excellent optical property.

14 Claims, 6 Drawing Sheets

LIGHT-EMITTING STRUCTURE AND A METHOD FOR FABRICATING THE SAME

CROSS-REFERENCES TO RELATED APPLICATIONS

This application relates to U.S. Ser. No. 61/216,374 filed on May 15, 2009, U.S. Ser. No. 61/273,129 filed on Jul. 30, 2009, U.S. Ser. No. 61/284,792 filed on Dec. 26, 2009, U.S. Ser. No. 12/587,290 filed on Oct. 5, 2009, U.S. Ser. No. 12/587,281 filed on Oct. 5, 2009, and U.S. Ser. No. 12/587,291 filed on Oct. 5, 2009, which are incorporated herein by reference.

BACKGROUND OF THE INVENTION

1. Field of the Invention

This invention relates to methods for transferring a uniform phosphor layer on an object, and, more particularly, to a method for transferring a uniform phosphor layer that converts the wavelength of light emitted by an LED, and a light-emitting structure fabricated thereby.

2. Description of Related Art

Phosphor materials are widely applied to LED packages that include blue pump LEDs and green or red phosphors and emit white light (e.g., a mixture of blue light emitted from the blue pump LEDs with green or red light converted from the blue light by the phosphor materials). Conventional methods for depositing phosphor materials on blue LED chip or package assembly include:

Slurry method: phosphor powders are distributed insilicon, epoxy resin or solvent filling material, to form a phosphor mixture, and the phosphor mixture is applied to a surface of an LED or a package lens material by spraying coating or immersing coating techniques.

The above conventional method faces a problem that an LED has an uneven package surface. The slurry method forms a layer of particles that does not have a uniform thickness. As a result, the LED does not have uniform light color points and the light converted by the phosphors has poor color uniformity. Moreover, the conventional methods are difficult to be applied to an uneven surface and to form a uniform layer of phosphors. It is a real challenge to use the conventional methods to satisfy lighting application demands.

The conventional method still suffers the problems that the distribution capacity of phosphors cannot be controlled, the LED does not have consistent light color points, and the light converted from the phosphors has poor color uniformity. Therefore, how to provide a method for transferring a uniform phosphor layer on an article and a light-emitting structure thus fabricated is becoming one of the most popular issues in the art.

SUMMARY OF THE INVENTION

In view of the above-mentioned problems of the prior art, the present invention provides a method for fabricating a light-emitting structure, comprising: providing a carrier having at least one LED die disposed on a surface thereof; covering the at least one LED die with a uniform phosphor layer, wherein an accommodation space is constituted by the carrier and the uniform phosphor layer; and forming a first light-pervious body in the accommodation space.

In an embodiment of the present invention, the uniform phosphor layer comprises phosphor powders and a binder material, and the phosphor powders in the uniform phosphor layer occupy more than 75% in volume of the uniform phosphor layer.

In another embodiment of the present invention, the uniform phosphor layer comprises phosphor powders constituted by a plurality of phosphor particles, none of which is completely separated from adjacent ones; and the uniform phosphor layer may be obtained by using an electrostatic charge process to uniformly adhere phosphor particles to the carrier.

In an embodiment of the present invention, a binder layer is further formed to secure the uniform phosphor layer, and the uniform phosphor layer is sandwiched between the binder layer and the carrier.

In an embodiment of the present invention, the uniform phosphor layer is first formed on a surface of a mold cavity of a first mold; and the method further includes, after the formation of the first light-pervious body, removing the first mold. In an embodiment of the present invention, the method further comprises, after the formation of the first light-pervious body (after the removal of the first mold), forming a second light-pervious body on the uniform phosphor layer such that the uniform phosphor layer is sandwiched between the first light-pervious body and the second light-pervious body.

In another embodiment of the present invention, the uniform phosphor layer is first formed on a surface of the second light-pervious body, such that, after the formation of the first light-pervious body, the uniform phosphor layer is sandwiched between the first light-pervious body and the second light-pervious body.

The present invention further provides a light-emitting structure, comprising a carrier; at least one LED die provided on the carrier; a first light-pervious body fanned on the carrier and covering the at least one LED die; and a uniform phosphor layer provided on the first light-pervious body and covering the at least one LED die. In the traditional method, the phosphor powders are generally distributed in the silicone or liquid, and then disposed on the surfaces of an LED or package, so the phosphor powders cannot be effectively distributed in the silicone or liquid uniformly. After the silicone or liquid in which the phosphor particles are distributed is coated on the LED element or package, the distribution uniformity of the phosphor powders cannot be controlled effectively. As a result, in the phosphor powders formed in the uniform phosphor layer by the conventional methods, some will congregate and connect to one another, while others exist independently. Therefore, the LED product has the problems of inconsistent light color points and that the color uniformity does not meet the demand. The present invention may overcome the conventional problems effectively. The method provided according to the present invention includes providing a carrier having at least one LED die disposed on a surface thereof; covering the at least one LED die with a uniform phosphor layer, wherein an accommodation space is constituted by the carrier and the uniform phosphor layer; and forming a first light-pervious body in the accommodation space. Therefore, a uniform phosphor layer in various shapes may be formed on the LED die, so as to provide excellent optical property. The uniform phosphor layer is formed on a surface of a mold or a second light-pervious body in advance such that the uniform phosphor layer may have color points and color rendering index defined in advance. As a result, the light-emitting structure thus fabricated has excellent optical property.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Phosphors convert or change light wavelengths, e.g., converting or changing a light source in an LED type. General phosphors include YAG material, TAG material, ZnSeS+ material, SiAlON material (e.g., α-SiAlON), etc. However, according to embodiments of the present invention, any material that converts or changes the wavelength of incident light may be used as a phosphor material. The term "phosphor" herein indicates any material that may convert or change a light wavelength to another wavelength, and includes a mixture or compound having wavelength changing materials. In an embodiment, the phosphor is in the form of powders, and may be called as phosphor powders. The phosphor powders are constituted by a plurality of phosphor particles.

First Embodiment

Figure 1A:
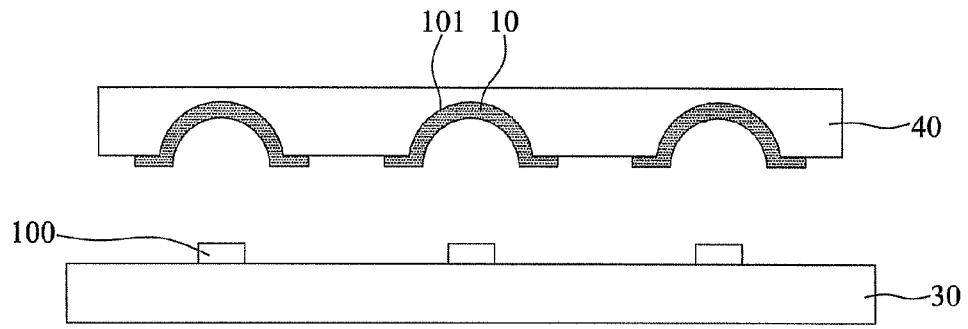
FIGS. 1A to 1C are schematic diagrams illustrating a method for fabricating a light-emitting structure according to the present invention.
Figure 1B:
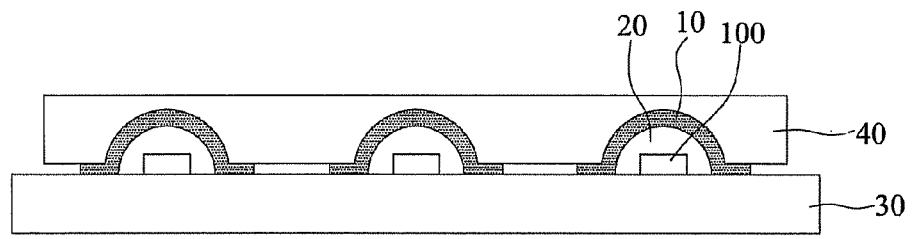
Figure 1C:
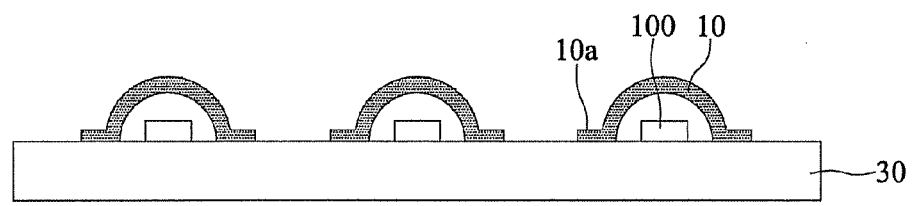

Please refer to FIGS. 1A to 1C, which illustrate a method of fabricating a light-emitting structure according to the present invention.

As shown in FIG. 1A, a carrier 30 is provided that has at least one LED die 100 provided on a surface thereof. Three LED dies 100 are exemplified in FIG. 1A. A uniform phosphor layer 10 is provided above the carrier 30. In an embodiment of the present invention, the uniform phosphor layer 10 that is substantially uniform is deposited on a surface of a first mold 40 (e.g., on a surface of a mold cavity 101) in a electrostatic charge process. The electrostatic charge process may refer to U.S. Ser. No. 61/216,374 filed on May 15, 2009, U.S. Ser. No. 61/273,129 filed on Jul. 30, 2009, U.S. Ser. No. 61/284,792 filed on Dec. 26, 2009, U.S. Ser. No. 12/587,290 filed on Oct. 5, 2009, U.S. Ser. No. 12/587,281 filed on Oct. 5, 2009, and U.S. Ser. No. 12/587,291 filed on Oct. 5, 2009, which are incorporated herein by reference.

For instance, the uniform phosphor layer 10 is formed by forming electrostatic charges on the first mold 40 or grounding the first mold 40, and causing the first mold 40 in a proximity of the uniform phosphor layer 10 to make the uniform phosphor layer 10, which has oppositely-charged phosphor powders or particles that are constituted by phosphor powder and a binder material, to be attached and secured to the surface of the first mold 40, so as to form the uniform phosphor layer 10. Of course, the phosphor powders may carry no charge, and the uniform phosphor layer 10 is formed by the first mold 40 that has charges. Different from the conventional electrochemistry charge process in a slurry environment, the electrostatic charge process is performed in a non-liquid environment. Accordingly, during the deposition process the phosphor powders and a binder material need not have uniform distribution in a liquid suspension, and will not suffer this problem. In a portion of the embodiments of the present invention, the phosphor powders and the binder material are formed and/or coated on a first surface of a mold. Therefore, the phosphor powders may have a coating density and layer thickness precisely controlled in the electrostatic charge process. In another embodiment of the present invention, a plurality of uniform phosphor layers may be formed by iterating the electrostatic charge process. The "particles that are constituted by phosphor powders and a binder material" are a mixture of phosphor powders and a binder material or the binder material capsulating the phosphor powders, and the phosphor powders occupy more than 75□ in volume of the uniform phosphor layer.

In an embodiment of the present invention, the electrostatic charge process or the deposition process is applied in a quasi-vacuum environment, where the phosphor powders are not disturbed. In an embodiment of the present invention, the uniform phosphor layer 10 comprises phosphor powders constituted by a plurality of phosphor particles, none of which is completely separated from adjacent ones. In an embodiment of the present invention, the uniform phosphor layer 10 may further comprise a binder layer (less than 10 μm in thickness, not shown) formed after the electrostatic charge process. In an embodiment of the present invention, the binder layer may be silicone, epoxy resin, glass, softens or any suitable material for an LED package. For example, the binder layer may include parylene that has excellent anti-moisture property, so as to prevent the phosphors or LEDs from being degraded during damp/hot operation conditions.

In an embodiment of the present invention, the carrier 30 may be an ordinary substrate such as a ceramic substrate, or be a silicon wafer or metal bar that has metal pads.

As shown in FIG. 1B, at least a portion of the uniform phosphor layer 10 covers the LED die 10, an accommodation space is constituted by the carrier 30 and the uniform phosphor layer 10, and a first light-pervious body 20 is formed in the accommodation space. In an embodiment of the present invention, the first light-pervious body 20 is silicone.

As shown in FIG. 1C, after the fat nation of the first light-pervious body 20, the first mold 40 is removed. In an embodiment of the present invention, a release agent or a release film may be provided on a surface of the mold cavity 101 of the first mold 40 such that the uniform phosphor layer 10 is easily separated from the first mold 40.

The portion of the uniform phosphor layer 10 that covers the at least one LED die 100 is further in contact with the carrier 30.

Second Embodiment

Please refer to FIG. 2A to 2F, which illustrate another method of fabricating a light-emitting structure according to the present invention. The second embodiment differs from the first embodiment in that, in the second embodiment, after the formation of the first light-pervious body 20, a second light-pervious body 20' is formed on the uniform phosphor layer 10 such that the uniform phosphor layer 10 is sandwiched between the first light-pervious body 20 and the second light-pervious body 20'.

Figure 2A:
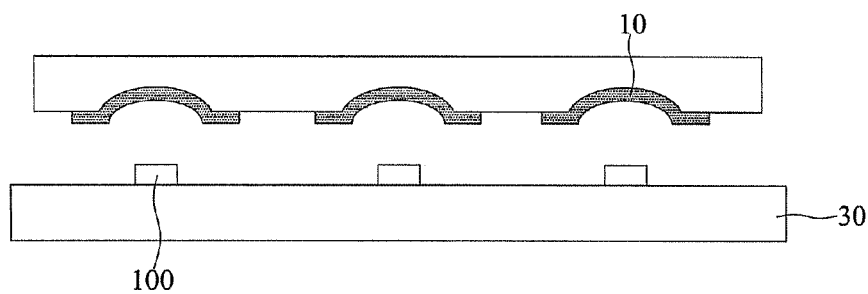
FIGS. 2A to 2F are schematic diagrams illustrating a method for fabricating another light-emitting structure according to the present invention.
Figure 2B:
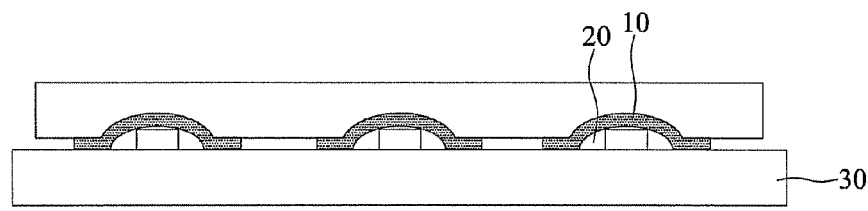
Figure 2C:
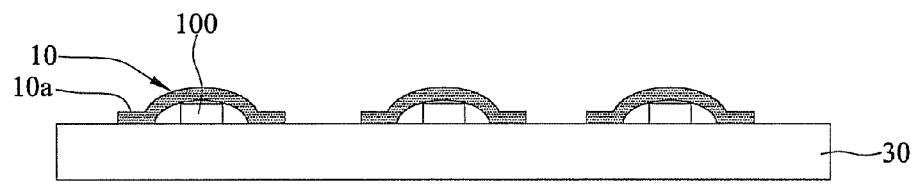
Figure 2D:
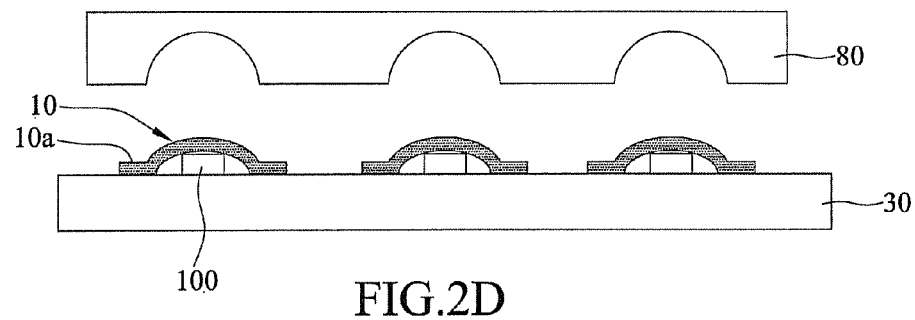
Figure 2E:
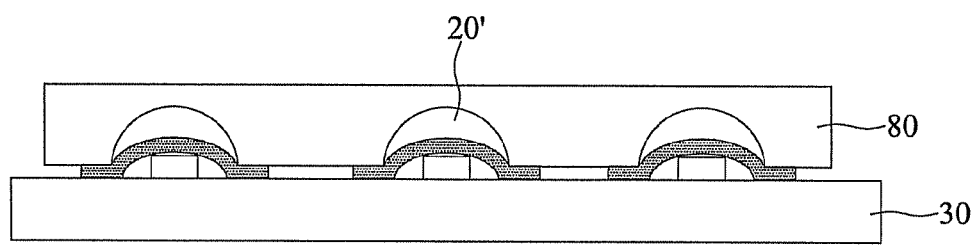
Figure 2F:
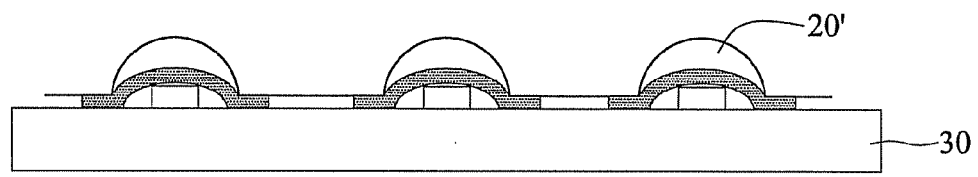

As shown in FIGS. 2A to 2C, thanks to the convenience of the molding process, a distance between the uniform phosphor layer 10 and the LED die 100 may be adjusted as required. As shown in FIGS. 2D to 2F, a fourth mold 80 is used to form the second light-pervious body 20', and the fourth mold 80 is then removed. Therefore, the method according to the present invention may form on the LED die a uniform phosphor layer in various shapes and intervals, so as to provide excellent optical property.

Third Embodiment

Please refer to FIGS. 3A to 3F, which illustrate yet another method of fabricating a light-emitting structure according to the present invention. The third embodiment differs from the second embodiment in the order of forming the second light-pervious body. In the third embodiment, the uniform phosphor layer 10 is formed on the second light-pervious body 20' first, and then the first light-pervious body 20 is formed in the accommodation space, such that the uniform phosphor layer 10 is sandwiched between the first light-pervious body 20 and the second light-pervious body 20'.

Figure 3A:
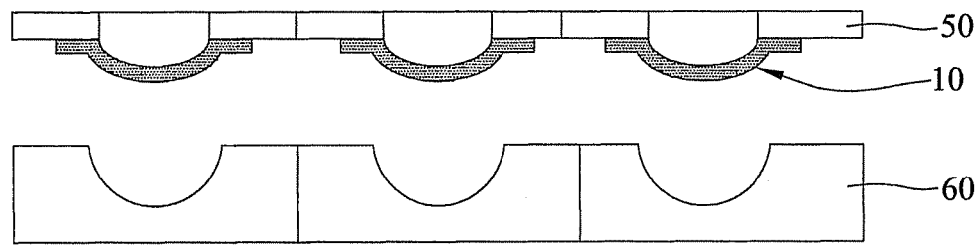
FIGS. 3A to 3F are schematic diagrams illustrating a method for fabricating yet another light-emitting structure according to the present invention.
Figure 3B:
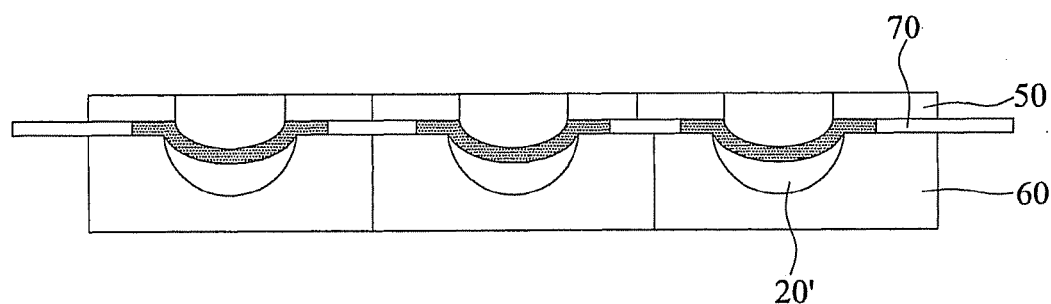

As shown in FIGS. 3A and 3B, a second mold 50 having a uniform phosphor layer 10 formed on a surface thereof; and molding and forming, with a third mold 60, a second light-pervious body 20' on the uniform phosphor layer 10. As shown in FIG. 3B, a connection part 70 surrounds the uniform phosphor layer 10, and is disposed on the carrier 30 after the uniform phosphor layer 10 covers the at least one LED die 100. In an embodiment of the present invention, the connection part 70 may be a lead frame or the uniform phosphor layer 10 and/or second light-pervious body 20' for array arrangement.

Figure 3C:
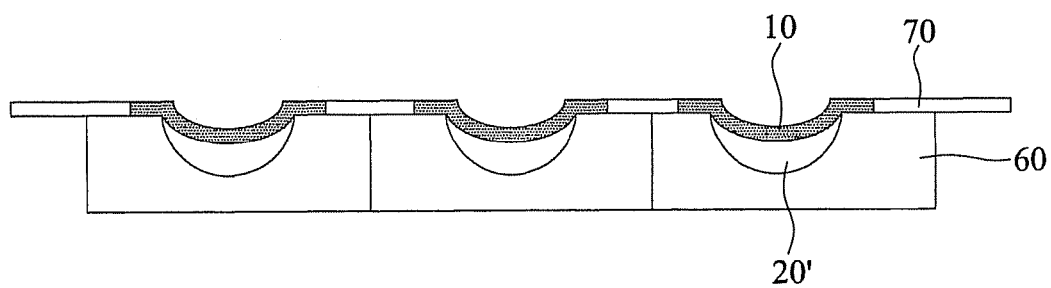

As shown in FIG. 3C, the second mold 50 is removed, and the uniform phosphor layer 10 is thus formed on a surface of the second light-pervious body 20'.

Figure 3D:
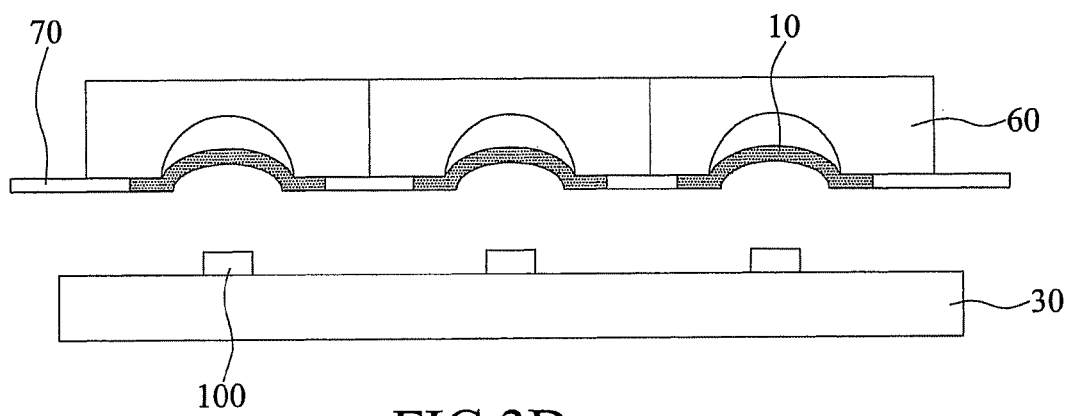
Figure 3E:
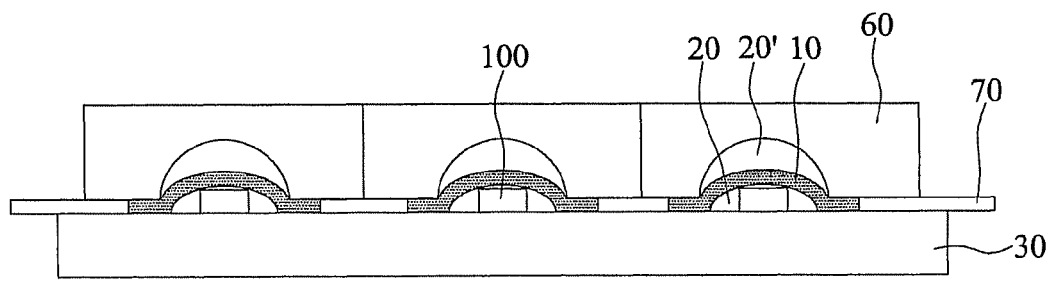
Figure 3F:
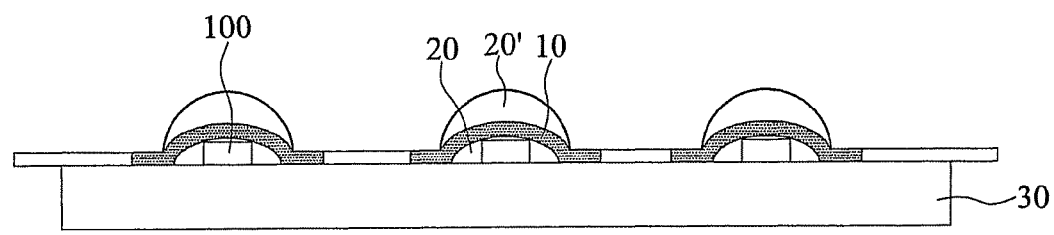

As shown in FIGS. 3D to 3F, according to the method disclosed in the second embodiment, the uniform phosphor layer 10 covers the LED die 100, the carrier 30 and the uniform phosphor layer 10 constitute an accommodation space, and the first light-pervious body 20 is formed in the accommodation space.

Fourth Embodiment

Figure 4A:
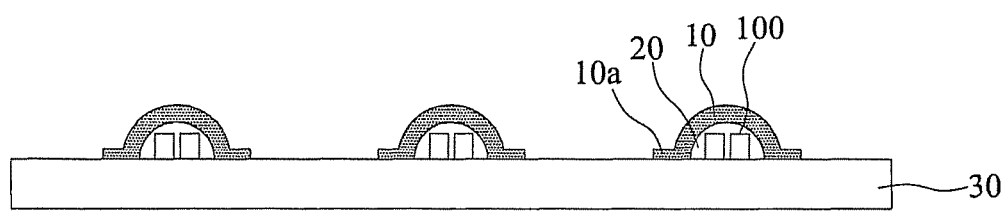
FIGS. 4A and 4B are schematic diagrams illustrating a uniform phosphor layer that covers at least one LED die.
Figure 4B:
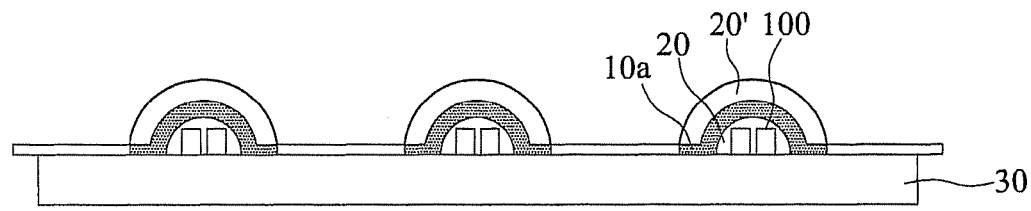

Please refer to FIGS. 4A and 4B, which show that the uniform phosphor layer 10 covers at least one LED die 100, such as two LED dies 100 as shown.

The first light-pervious body 20 and the second light-pervious body 20' fabricated by the method according to the present invention may be fabricated to be a lens structure as required. When the uniform phosphor layer 10 is sandwiched between the first light-pervious body 20 and the second light-pervious body 20', the second light-pervious body 20' may have a lens structure according to design requirements.

According to the methods described above, the present invention also provides a light-emitting structure that comprises a carrier 30; at least one LED die 100 provided on the carrier 30; a first light-pervious body 20 formed on the carrier 30 and covering the at least one LED die 1001; and a uniform phosphor layer 10 provided on the first light-pervious body 20 and covering the at least one LED die 100.

In an embodiment of the present invention, the light-emitting structure further comprises a second light-pervious body 20' formed on the uniform phosphor layer 10, and the uniform phosphor layer 10 is sandwiched between the first light-pervious body 20 and the second light-pervious body 20'. In an embodiment of the present invention, a portion of the uniform phosphor layer 10, e.g., a laterally extending portion 10a, is in contact with the carrier 30.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method for fabricating a light-emitting structure, comprising:
   providing a carrier having at least one LED die disposed on a surface thereof;
   forming a uniform phosphor layer in a mold cavity of a first mold;
   covering the at least one LED die with the uniform phosphor layer, wherein an accommodation space is constituted by the carrier and the mold cavity of the first mold;
   forming a first light-pervious body in the accommodation space to be combined with the uniform phosphor layer; and
   removing the first mold, wherein the uniform phosphor layer is formed on a surface of the first light-pervious body.

2. The method of claim 1, wherein the uniform phosphor layer comprises phosphor powders and a binder material.

3. The method of claim 2, wherein the phosphor powders in the uniform phosphor layer occupy more than 75% in volume of the uniform phosphor layer.

4. The method of claim 1, wherein the uniform phosphor layer comprises phosphor powders constituted by a plurality of phosphor particles, none of which is completely separated from adjacent ones.

5. The method of claim 1, further comprising, after removal of the mold, forming a second light-pervious body on the uniform phosphor layer, wherein the uniform phosphor layer is sandwiched between the first light-pervious body and the second light-pervious body.

6. The method of claim 1, wherein a second light-pervious body is formed on a surface of the mold cavity of the first mold, and the uniform phosphor layer is formed on a surface of the second light-pervious body, such that, after the first light-pervious body is formed, the uniform phosphor layer is sandwiched between the first light-pervious body and the second light-pervious body.

7. The method of claim 6, wherein the second light-pervious body is formed by:
   providing a second mold having the uniform phosphor layer formed on a surface thereof;
   molding and forming the second light-pervious body on the uniform phosphor layer with the first mold; and
   removing the second mold, wherein the second light-pervious body is sandwiched between the uniform phosphor layer and the surface of the first mold.

8. The method of claim 6, further comprising a connection part that surrounds the uniform phosphor layer, and is disposed on the carrier after the uniform phosphor layer covers the at least one LED die.

9. The method of claim 1, wherein the uniform phosphor layer has a portion that covers the at least one LED die and is in contact with the carrier.

10. A light-emitting structure, comprising:
a carrier;
at least one LED die provided on the carrier;
a first light-pervious body formed on the carrier and covering the at least one LED die; and
a uniform phosphor layer provided on the first light-pervious body and covering the at least one LED die, wherein the uniform phosphor layer has a laterally extending portion in contact with the carrier, and the uniform phosphor layer is formed by using an electrostatic charge process, such that the phosphor powders in the uniform phosphor layer occupy more than 75% in volume of the uniform phosphor layer.

11. The light-emitting structure of claim 10, wherein the uniform phosphor layer comprises phosphor powders and a binder material.

12. The light-emitting structure of claim 10, wherein the uniform phosphor layer comprises phosphor powders constituted by a plurality of phosphor particles, none of which is completely separated from adjacent ones.

13. The light-emitting structure of claim 10, further comprising a second light-pervious body formed on the uniform phosphor layer, wherein the uniform phosphor layer is sandwiched between the first light-pervious body and the second light-pervious body.

14. The light-emitting structure of claim 13, wherein the second light-pervious body is free from being in contact with the carrier.

* * * * *